United States Patent [19]
Cantor et al.

[11] Patent Number: 5,767,043
[45] Date of Patent: Jun. 16, 1998

[54] MULTIPLE SQUID DIRECT SIGNAL INJECTION DEVICE FORMED ON A SINGLE LAYER SUBSTRATE

[75] Inventors: Robin H. Cantor, San Jose; Michael J. Burns, Mountain View, both of Calif.

[73] Assignee: Conductus, Inc., Sunnyvale, Calif.

[21] Appl. No.: 393,131

[22] Filed: Feb. 21, 1995

[51] Int. Cl.$^6$ .................... H01L 39/00; G01R 33/035
[52] U.S. Cl. .................... 505/162; 324/248; 505/846
[58] Field of Search ............... 324/248; 505/845, 505/846, 162

[56] References Cited

U.S. PATENT DOCUMENTS

| | | | |
|---|---|---|---|
| 4,280,095 | 7/1981 | Hinton | 324/248 |
| 5,157,466 | 10/1992 | Char et al. | 357/5 |
| 5,219,826 | 6/1993 | Kapitulnik | 505/1 |
| 5,252,921 | 10/1993 | Nakane et al. | 324/248 |

FOREIGN PATENT DOCUMENTS

| | | | |
|---|---|---|---|
| 4120587 | 2/1993 | Germany | 324/248 |

OTHER PUBLICATIONS

Clarke, J., "SQUIDS: Theory and Practice", New Superconductivity Electronics, Kluwer Academic Publishers (1993) pp. 123–180.

Miklich, A.H., et al., "Bicrystal YBCO Dc SQUIDs With Low Noise", IEEE Transactions of Applied Superconductivity (1993) 3:(1)2434–2437.

Koelle, D. et al., "DC SQUID magnetometers from single layers of $YBa_2Cu_3O_{7-x}$", Applied Phisics Letters (1993) 63:(16)2271–2273.

Zhang, Y., et al., "Sensitive rf–SQUIDs and Magnetometers Operating at 77 K", IEEE Transactions on Applied Superconductivity (1993) 3:(1)2465–2468.

*Primary Examiner*—Walter E. Snow
*Attorney, Agent, or Firm*—Merchant, Gould, Smith, Edell, Welter, & Schmidt, P.A.

[57] ABSTRACT

A low-noise directly coupled dc SQUID magnetometer is disclosed. The magnetometer provides for single layer fabrication and is particularly applicable to high-$T_c$ superconductors operating at 77 Kelvin. A pair of dc SQUIDs are connected and biased in series such that the output voltage modulation with applied flux of the dual SQUID magnetometer, is double that of a single SQUID magnetometer. The bias current is applied to one SQUID and removed from the second SQUID of the pair. The magnetometer pick-up coil is directly coupled to the SQUID pair, providing for coherent modulation of the series-connected SQUIDS and a reduction of flux density noise of the device by a factor of $1/\sqrt{2}$.

19 Claims, 8 Drawing Sheets

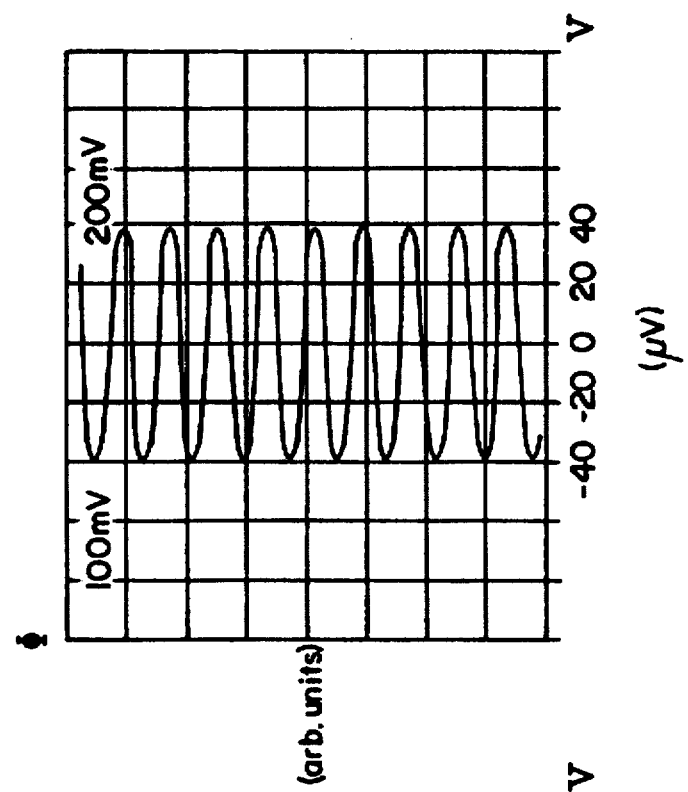
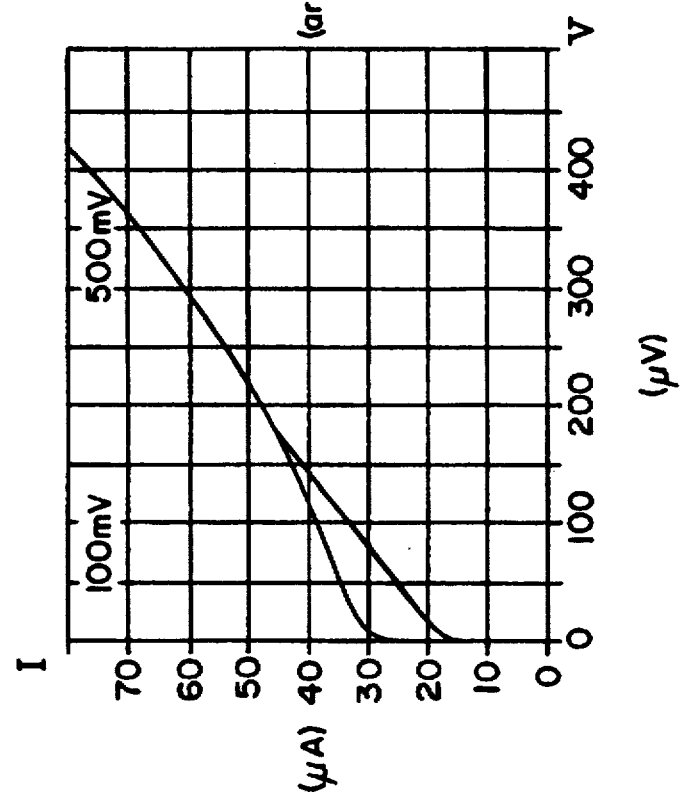
FIG. 8B
FIG. 8A

5,767,043

MULTIPLE SQUID DIRECT SIGNAL INJECTION DEVICE FORMED ON A SINGLE LAYER SUBSTRATE

STATEMENT OF GOVERNMENT INTEREST

The U.S. Government has a paid-up license on this invention and the right in limited circumstances to require the patent owner to license others on reasonable terms provided for by the terms of contract No. N00014-94-C-0082 awarded by the Office of Naval Research.

FIELD OF THE INVENTION

This invention relates generally to superconducting quantum interference devices (SQUIDs), and more particularly to a double SQUID direct signal injection magnetometer.

BACKGROUND OF THE INVENTION

Superconducting quantum interference devices (SQUIDs) are the most sensitive magnetic flux detectors currently available. They have extensive versatility in being able to measure any physical quantity that can be converted to a magnetic flux, as for example a magnetic field, magnetic field gradient, current, voltage, displacement and magnetic susceptibility. Consequently, the applications for using SQUIDs are quite extensive. The SQUID susceptometer has been widely used by scientists in laboratory applications for many years, but more recent advances in SQUID technology have greatly expanded its use beyond the laboratory. In the medical arena, SQUIDs are more commonly being used in magnetoencephalography and magnetocardiology, wherein SQUID magnetometers are used to measure the tiny magnetic signals generated in the brain and heart respectively. They have also been used with superconducting magnets to create magneto-ferritometers for monitoring iron levels in the liver. In the commercial marketplace, the military has expended considerable development effort on a variety of SQUID applications. In the area of geophysics, SQUIDs have found many applications, from prospecting for oil and minerals to earthquake prediction both through the use of active and passive SQUID systems. SQUID technology is also useful for non-destructive evaluation, including both the integrity evaluation of structures and the location of submerged or buried structures or members.

SQUIDs combine the physical phenomenons of flux quantization and Josephson effect. The Josephson effect occurs at boundaries between superconducting regions. Such boundaries may be achieved in a number of known ways. Grain boundary junctions occur at crystalline grain boundaries and are further discussed in Char et al., U.S. Pat. No. 5,157,466. Boundaries of the "tunneling type" occur where a very thin insulator is interposed between two superconductors. SNS junctions use a very thin normal conductor or weakly superconducting material as the boundary. Nanobridge junctions use a severely restricted area of superconductor to form a weak link and are further discussed in Kapitulnik, U.S. Pat. No. 5,219,826. Flux quantization means that the flux ($\Phi$) through a closed superconducting loop is quantized in units of the flux quantum ($\Phi_o$).

In general, a SQUID comprises a superconducting loop that is broken in at least one place by a Josephson junction. There are two kinds of SQUIDs. The first, the rf SQUID, uses a single Josephson junction to interrupt the current flow around a superconducting loop, and is operated with a radiofrequency flux bias. Early experimentations were conducted with rf SQUIDS due primarily to the fact that early Josephson junction fabrication technology most readily lent itself to the commercial production of single Josephson junction devices. The second type of SQUID is the dc SQUID which has two or more Josephson junctions connected in parallel in a superconducting loop and is biased with a steady or "dc" current bias. More recently, thin film technology has been applied to SQUID construction, making the design of dc SQUIDS more commercially practical. Both of these concepts are readily understood by those skilled in the art and will not be detailed herein. Those not as knowledgeable with SQUID technology and theory of operation are referred to "SQUIDs: Theory & Practice" John Clarke, *New Superconductivity Electronics*, Kluwer Academic Publishers, 1993, incorporated herein by reference.

In simple terms, a dc SQUID is a magnetic flux-to-voltage convertor, since it provides an output voltage across the Josephson junctions which varies as a function of the total magnetic flux applied to its superconducting loop. The output voltage is periodic in the applied flux, with a period of one flux quantum ($\Phi_o \equiv h/2e \cong 2.07 \times 10^{-5}$ Wb). By applying a dc bias current and dc flux to the SQUID, to set a quiescent voltage output level, magnetic fields producing a flux in the SQUID of much less than a single flux quantum ($\Phi_o$) can be detected by measuring the deviation of the SQUID output voltage from the quiescent value.

The dc SQUID is the most sensitive sensor of magnetic flux available, and displays an enormous frequency response extending from dc to several GHz. The design of the SQUID determines the intrinsic performance of the device. It has been shown that the energy resolution of a low-inductance SQUID operating at 4.2 K can approach the quantum limit.

Besides the "rf" and "dc" SQUID distinctions, the physical nature and the resultant performance characteristics of a SQUID are related to the type of superconductor materials used in its fabrication. Historically, the early superconductors and resultant SQUIDs made therewith exclusively used "low-temperature" superconductor materials that displayed superconductivity near absolute zero. The use of such low-temperature superconductors requires such materials to be placed in liquid helium at 4.2 K (−269° C.). With fabrication technology advances over the years, SQUIDs and magnetometers and other devices made therefrom are now commonly fabricated using single or multiple-layer thin film depositions and photolithographic and etching techniques well-known in the semiconductor industry. The most common low-temperature SQUID devices commercially available today use metals such as niobium as the superconductor material. Low-temperature SQUID devices typically use Josephson junctions formed from stacked horizontal films parallel to the substrate.

With the discovery in 1986 of materials displaying superconductivity at temperatures over 77 K, the accessibility of SQUID technology has significantly increased since the higher temperature devices allow for operation with liquid nitrogen (at 77 K) rather than with the much more expensive liquid helium. The higher temperature materials are generally referred to as high transition temperature "high-$T_c$" superconductor or "HTS" materials. Ceramics are the most common high-$T_c$ superconductor materials used in SQUID technology, with the most popular being $YBa_2Cu_3O_{7-x}$ (most commonly called YBCO) having a transition temperature of 90 K. High-$T_c$ SQUID devices typically use a vertical Josephson junction technology where the plane of the junction is perpendicular to the substrate, as for example junctions produced by grain-boundaries between two contiguous regions of a superconductor material having different grain or crystal orientations on either side of their juncture.

In practical SQUID magnetometer applications, the SQUID is often coupled to an input circuit generally having one or more pick-up loops or coils of superconducting material capable of capturing more flux than the relatively small SQUID loop, and therefore significantly increasing the magnetic field resolution of the device. Signals from the pick-up loop(s) can be either "directly" or "inductively" coupled to the SQUID loop. In low temperature SQUIDs the inductive coupling method is typically implemented by means of a multi-layer configuration. In such devices, the thin film superconductor washer forming the SQUID loop is covered by an insulating layer on top of which is grown a thin film spiral superconductor coil with as many as several tens of turns, which acts as an input or transformer coil to inductively couple or transfer signals from the input coil to the underlying SQUID loop. The input coil in turn is physically connected to an appropriate external magnetic flux pick-up loop. For high-$T_c$ materials the pick-up and input coils may also be integrated with the SQUID to form a monolithic magnetometer structure, or the flux transformer and SQUID may be fabricated on separate chips and then bonded together in "flip-chip" configuration. While the design of such a flux transformer is straightforward, its fabrication with multilayer structures using high-$T_c$ superconductors is not. Further, such high-$T_c$ material multilayer devices usually exhibit substantial low-frequency 1/f noise for frequencies (f) below 1 kHz, even though they have excellent electrical transport properties. For these reasons, inductively coupled high-$T_c$ material SQUIDs remain unattractive for low frequency applications.

The direct coupling approach employs a "single" superconductor layer construction wherein the magnetometer pick-up coil and the SQUID are physically formed and electrically connected by the same layer of superconductor material. This approach, also referred to as a "direct signal injection" method, greatly simplifies the device fabrication, since multiple layer depositions or the creation of multilayer flip-chip structures are not required. The single layer direct coupling approach has become particularly attractive for use with the high-$T_c$ thin-film superconductor materials. While in theory, the directly coupled design is less sensitive than the inductively coupled design, for many low frequency applications where noise is a significant factor, it currently offers the best performance.

Various efforts have been undertaken recently to produce high-$T_c$ material SQUID magnetometers having low noise at low frequencies and to analyze those sources contributing to the low frequency 1/f noise of such direct coupled SQUID magnetometers. In investigating the origin of such noise, Miklich et al found that noise contributions inherent to the junctions which might arise from critical current fluctuations can be reduced by applying appropriate electronic modulation schemes to the dc SQUID. They also found, however, that such modulation schemes do not affect noise contributions that may arise from the motion of vortices trapped in the body of the SQUID. These findings are summarized in an article by A. H. Miklich, D. Koelle, E. Dantsker, D. T. Nemeth, J. J. Kingston, R. F. Kromann and J. Clarke entitled "Bicrystal YBCO DC SQUIDs With Low Noise" published in *IEEE Transactions on Applied Superconductivity*, Vol.3, No.1, March 1993, herein incorporated by reference. Koelle et al. have reported a field noise at 1 Hz of 93fT/$\sqrt{Hz}$ for a direct coupled dc SQUID magnetometer constructed from a single layer YBCO device operating at 77 K. The reader is referred to the article by D. Koelle, A. H. Miklich, F. Ludwig, E. Dantsker, D. T. Nemeth and John Clarke, entitled "DC SQUID Magnetometers From Single Layers of YBa$_2$Cu$_3$O$_{7-x}$." published in *Applied Physics Letters*, Vol.63, pp 2271–2273, 1993, herein incorporated by reference. The reader is also referred to the approach taken by Zhang et al who took advantage of the flux focusing effect of a larger superconducting washer, wherein the effective area of the SQUID was enhanced without increasing the SQUID inductance. Zhang et al. reported a magnetic field noise of 170 fT/$\sqrt{Hz}$ for frequencies down to 1 Hz for a large washer rf SQUID operating at 77 K. To the extent that the disclosures of their findings are relevant to a more complete understanding of this invention the article by Y. Zhang, M. Muck, K. Hermann, J. Schubert, W. Zander, A. I. Braginski and C. Heiden entitled "Sensitive rf-SQUIDs and Magnetometers Operating at 77 K" published in *IEEE Transactions of Applied Superconductivity*, Vol.3, pp.2465–2468, March 1993, is also herein incorporated by reference.

The present inventor has also contributed to the development of a low-noise direct coupled magnetometer made from high-Tc materials, which displayed a magnetic field noise of 26 fT/$\sqrt{Hz}$ at 1 Hz, which is believed to be the lowest field noise to date for a single layer dc SQUID operating at 77 K. These results are reported in a paper entitled "Low-Noise Single-Layer YBa$_2$CU$_3$O$_{7-x}$ DC SQUID Magnetometers at 77 K" by R. Cantor, L. P. Lee, M. Teepe and V. Vinetskiy (printed by Conductus, Inc., of Sunnyvale, Calif.) presented at the Applied Superconductivity Conference on Oct. 17–21, 1994 in Boston, Mass. The paper, which is attached hereto as Appendix "A," will be published in *IEEE Transactions on Applied Superconductivity*, March 1995, and is herein fully incorporated by reference.

All of the above investigations and developments have concentrated on optimizing layout, design, or process parameters, or materials in an attempt to improve the device performance and reduce its noise susceptibility. For example, typical considerations for improving magnetic field resolution have centered around design considerations such as reducing SQUID inductance, increasing dimensions or shapes of the pick-up loop or using higher resolution junctions or more refined types of techniques for depositing or growing the high-$T_c$ materials. The present invention goes beyond such prior considerations and examines a new direct coupled magnetometer configuration that can be used with most existing dc SQUID design, to further reduce the noise susceptibility (characteristics) of magnetometers made with such SQUID designs.

SUMMARY

This invention provides a simple but unique design tool for constructing a low-noise dc SQUID magnetometer that enhances the signal output and thereby reduces the noise sensitivity of the magnetometer. While the preferred application of the invention is for use with single-layer high-$T_c$ superconductor materials, the principles of the invention also generally apply to low-temperature SQUID designs. As will be appreciated by those skilled in the art, the principles of this invention generally apply to most dc SQUID configurations, and offer an enhancement of the signal output by up to a factor of two over previous designs using direct signal injection.

According to one embodiment of the invention, there is provided a single layer multiple SQUID configuration comprising:

(a) a substrate;

(b) superconductor materials adhered in a single layer to said substrate in a pattern defining:

(i) a first dc SQUID having a first pair of Josephson junctions and defining a first SQUID loop;

(ii) a second dc SQUID having a second pair of Josephson junctions and defining a second SQUID loop;

(iii) an interconnecting link connecting the first and second SQUID loops in series;

(iv) a first bias lead operatively extending from the first SQUID loop to a first output terminal; and (v) a second bias lead operatively extending from the second SQUID loop to a second output terminal; and (c) wherein bias current applied through the first output terminal and bias lead to the first SQUID is withdrawn from the second SQUID by the second bias lead and output terminal, such that the first and second SQUIDS are operatively connected in series.

According to a further aspect of the invention, the substrate defines a grain boundary, wherein the first and second pairs of Josephson junctions overlie the grain boundary. In such configuration, the interconnecting link is preferably oriented to lie parallel to and in close proximity with the grain boundary. According to yet another aspect of the invention, the first and second SQUID loops define first and second signal injection ports respectively and the superconductor material pattern further defines a pick-up loop having ends operatively connected to the first and second signal injection ports for operatively connecting the pick-up loop in parallel with the series connected SQUIDs to form a single layer direct signal injection magnetometer. According to still a further aspect of the invention, the interconnecting link between the series-connected SQUIDs is extended by a third bias lead to a third output terminal for enabling independent biasing of the first and second SQUIDs.

According to another aspect of the invention, there is provided a low-noise directly coupled dc SQUID magnetometer, comprising:

(a) a pair of dc SQUIDs operatively connected in a series configuration;

(b) a pick-up loop operatively directly coupled in parallel with the pair of dc SQUIDs; and (c) wherein the dc SQUIDs and the pick-up loop are all configured from a single layer of superconductor material; whereby signals in the pick-up loop are directly injected into said pair of dc SQUIDs.

Such magnetometer may be configured from a high-$T_c$ superconductor material such as a YBCO film.

According to yet another aspect of the invention, there is provided a low-noise directly coupled dc SQUID magnetometer, comprising:

(a) a pair of dc SQUIDs operatively connected in series by an interconnecting link;

(b) a pick-up loop operatively directly coupled in parallel with the pair of dc SQUIDS;

(c) an output terminal operatively connected with the interconnecting link; and (d) wherein the dc SQUIDS, interconnecting link and pick-up loop are all configured from a single layer of superconductor material; whereby signals in the pick-up loop are directly injected into the pair of dc SQUIDS.

These aspects of the invention are only exemplary of embodiments of configurations and/or materials used to implement structures that practice the broad principles of this invention. It will be understood that those skilled in the art may readily perceive yet other variations of the invention not specifically described above or in the following specification, but clearly included within the scope of the appended claims.

BRIEF DESCRIPTION OF THE DRAWING

Referring to the Drawing wherein like numerals represent like parts throughout the several views:

FIG. 6 represents plots of measured parameters of a first SQUID of an experimental magnetometer configured as in FIG. 5; wherein

FIG. 7 represents plots of measured parameters of a second SQUID of an experimental magnetometer configured as in FIG. 5; wherein FIG. 8 represents plots of measured parameters of the series connected first and second SQUIDs of the experimental magnetometer having the individual first and second SQUID parameters of FIGS. 6 and 7; wherein FIG. 8a illustrates the I–V characteristics of the magnetometer, and FIG. 8b illustrates the V-$\Phi$ characteristics of the magnetometer.

DETAILED DESCRIPTION OF THE INVENTION

Figure 1:
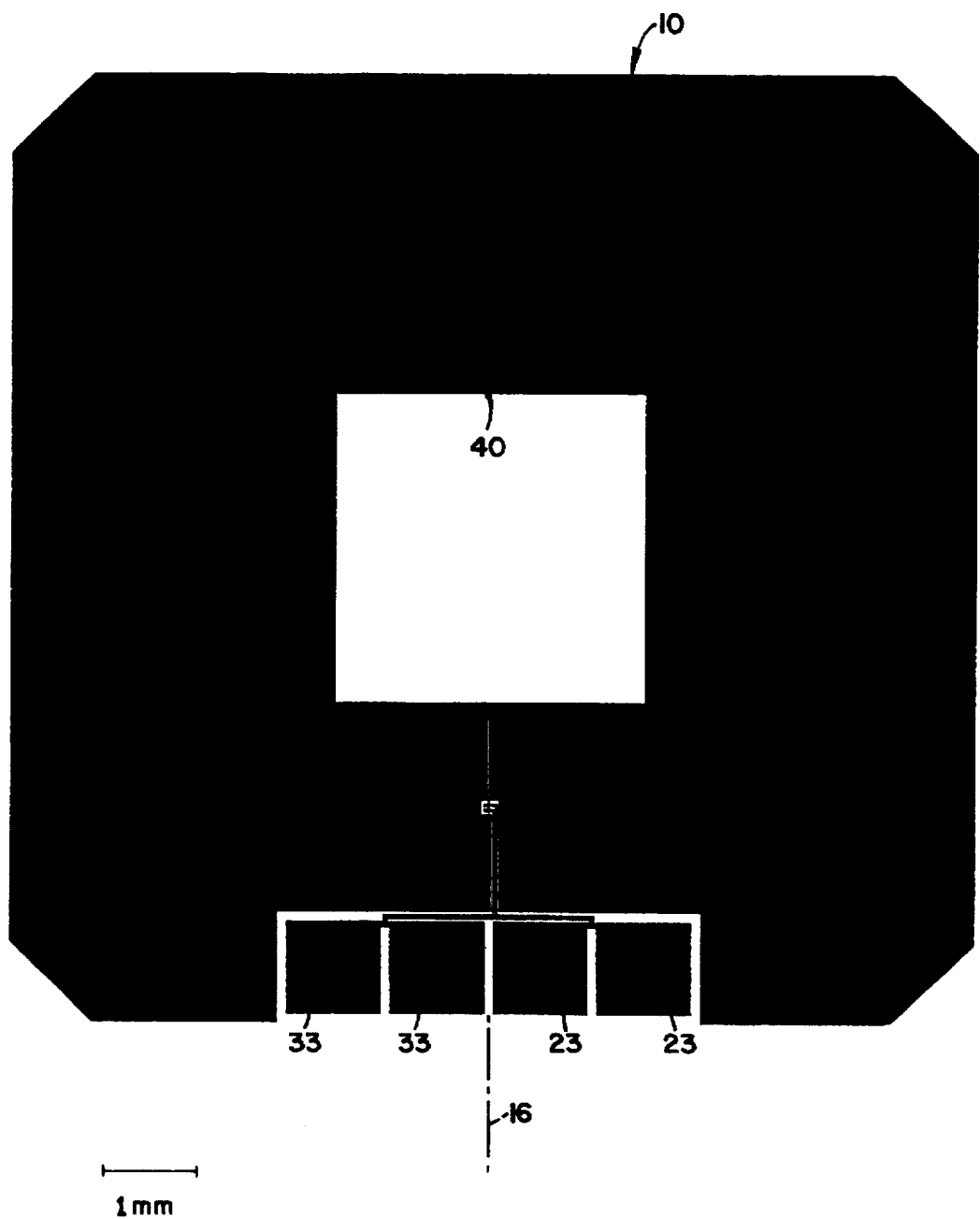
FIG. 1 illustrates a scaled representation of a multiple SQUID direct signal injection magnetometer constructed according to the principles of this invention.

A preferred embodiment of a SQUID magnetometer configured according to the principles of this invention is generally illustrated at 10 in FIG. 1. The FIG. 1 diagram is an approximate enlarged scaled illustration of the magnetometer, having outer dimensions of approximately 1 cm by 1 cm. The magnetometer of the preferred embodiment is fabricated from 150–300 nm thick c-axis oriented YBCO films deposited on a $SrTiO_3$ bicrystal substrate with a 24° misorientation angle. It will be appreciated that while a bicrystal grain boundary substrate is illustrated for the preferred embodiment, the principles of the invention apply as well to step-edge, SNS, or to any other available Josephson junction process technology, either currently available or to be developed in the future. It will also be appreciated that the principles of the invention apply as well to other known superconductors and to other substrates. Substrates for YBCO include sapphire, magnesium oxide, lanthanum aluminate and yttrium zirconium oxide, with or without buffer layers. The YBCO films of the preferred embodiment are patterned by ion milling through a photoresist mask. It will be appreciated, however, that any known method of patterning YBCO films, including wet etching and shadow masking may be used. The contact pads are covered by a gold layer which is ion beam deposited through a photoresist lift-off stencil. However, the invention does not require a gold contact pad. Other conductive metals may be used.

Figure 2:
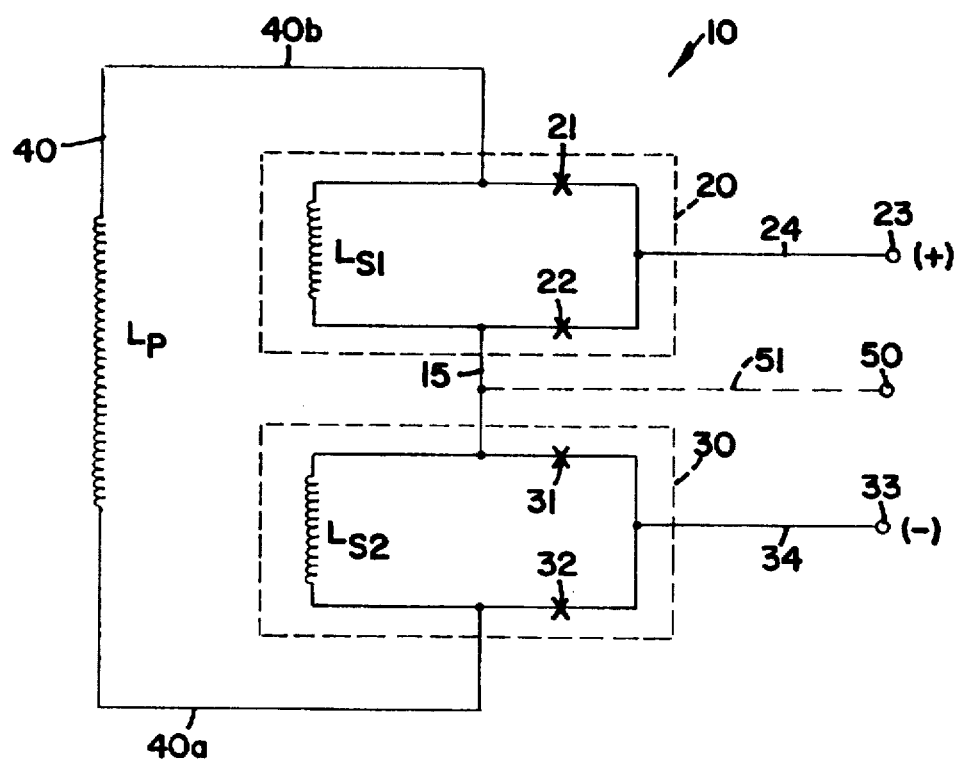
FIG. 2 is a schematic diagram of the equivalent circuit of the magnetometer of FIG. 1.

The magnetometer design connects a pair of identical low-noise dc SQUIDs in series and directly couples the series-connected SQUIDs to a single loop pick-up coil. An equivalent schematic diagram model of the magnetometer 10 is illustrated in FIG. 2. Referring thereto, a pair of identical dc SQUIDS 20 and 30 are connected in series by means of an interconnecting link 15. The Josephson junctions for SQUID 20 are depicted at 21 and 22, and its equivalent loop inductance is generally illustrated by the inductor $L_{s1}$. The Josephson junctions for SQUID 30 are depicted at 31 and 32, and its equivalent loop inductance is generally illustrated by the inductor $L_{s2}$. Bias current is applied through the (+) terminal 23 to the Josephson junctions and loop of SQUID 20, and is withdrawn through the (−) terminal 33 from the Josephson junctions and loop of SQUID 30. A single loop pick-up coil 40, having an equivalent inductance indicated by the inductor $L_p$, is directly connected in parallel with the series-connected SQUIDS 20 and 30.

Figure 4:
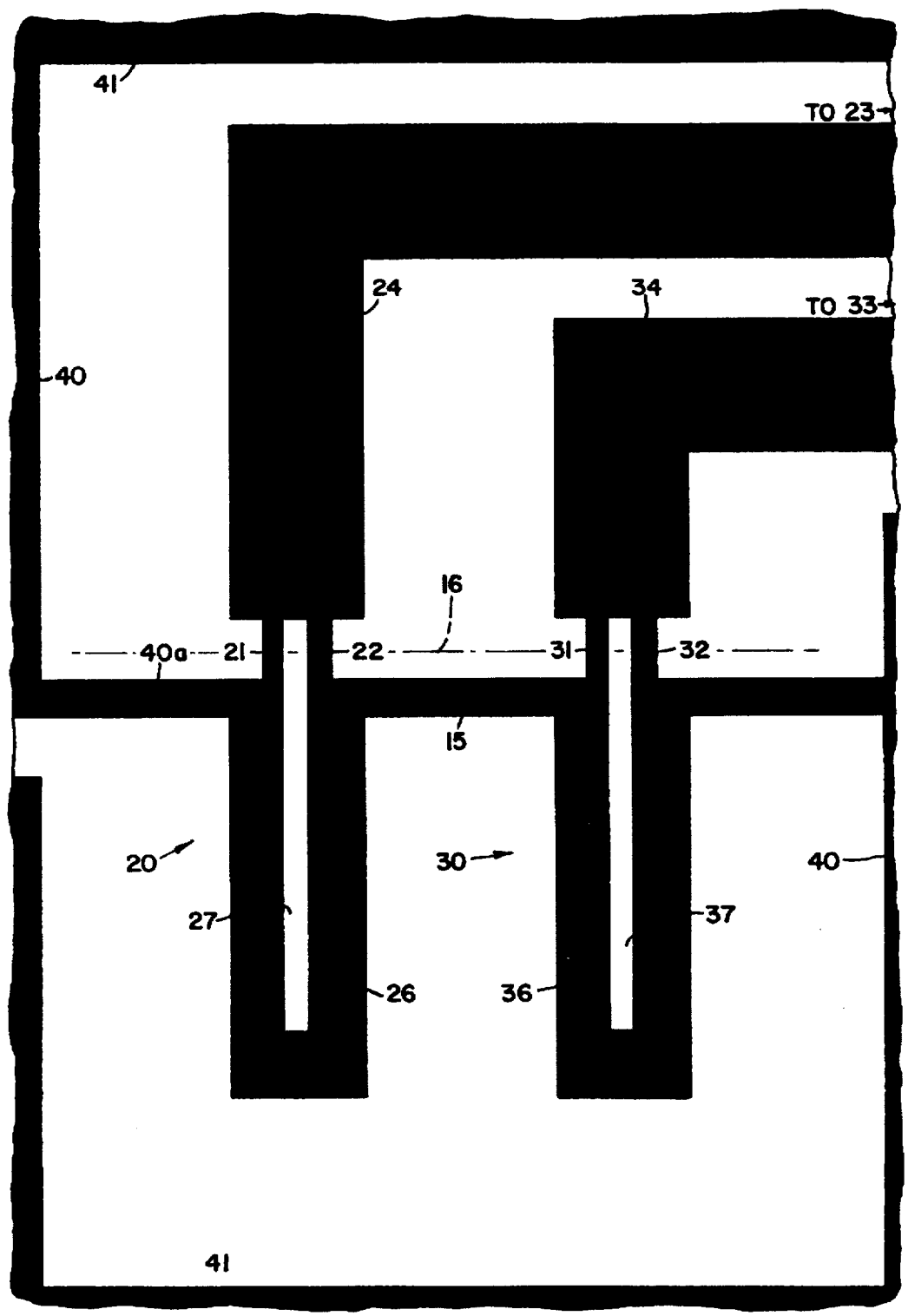
FIG. 4 is an enlarged view of the SQUID portion of the magnetometer of FIG. 1, illustrated at a magnification of approximately 160 times that of FIG. 1.

While the principles of this invention apply to virtually any type of dc SQUID design, the preferred configuration for each of the dc SQUIDs 20 and 30 is that described in Cantor et al. paper of Appendix "A," herein fully incorporated by reference. An enlarged illustration of the preferred series-connected SQUID configuration is shown in FIG. 4. Referring thereto, the body portions of SQUIDs 20 and 30 are formed from narrow strips of superconductor 26 and 36 respectively, with slits 27 and 37 formed along their respective lengths and sized so as to preserve the SQUID loops enclosing the slits. The Josephson junctions 21, 22, 31 and 32 are located at one end of the slits 27 and 37, along the grain boundary 16 of the substrate, as indicated in FIG. 4.

The signal injection paths 40a and 40b from the pick-up coil 40 to the SQUIDs, and the interconnecting link 15 used to establish the series connection between the SQUIDs 20 and 30 are arranged symmetrically and in line with one another and as close as possible to the Josephson junctions of each SQUID, as illustrated, in order to maximize coupling. The position of the link 15 results in an asymmetric bias condition that causes a lateral shift of the voltage-flux characteristics of each SQUID, as is shown in more detail hereinafter. Because of the symmetry, the magnitude and sign of this shift is the same for both SQUIDs. Further, the width of the interconnecting link 15 is relatively smaller than the superconductor body widths 26 and 36 of the SQUIDs 20 and 30 respectively, so as to maximize the amount of current flow around the SQUID loops.

Figure 3:
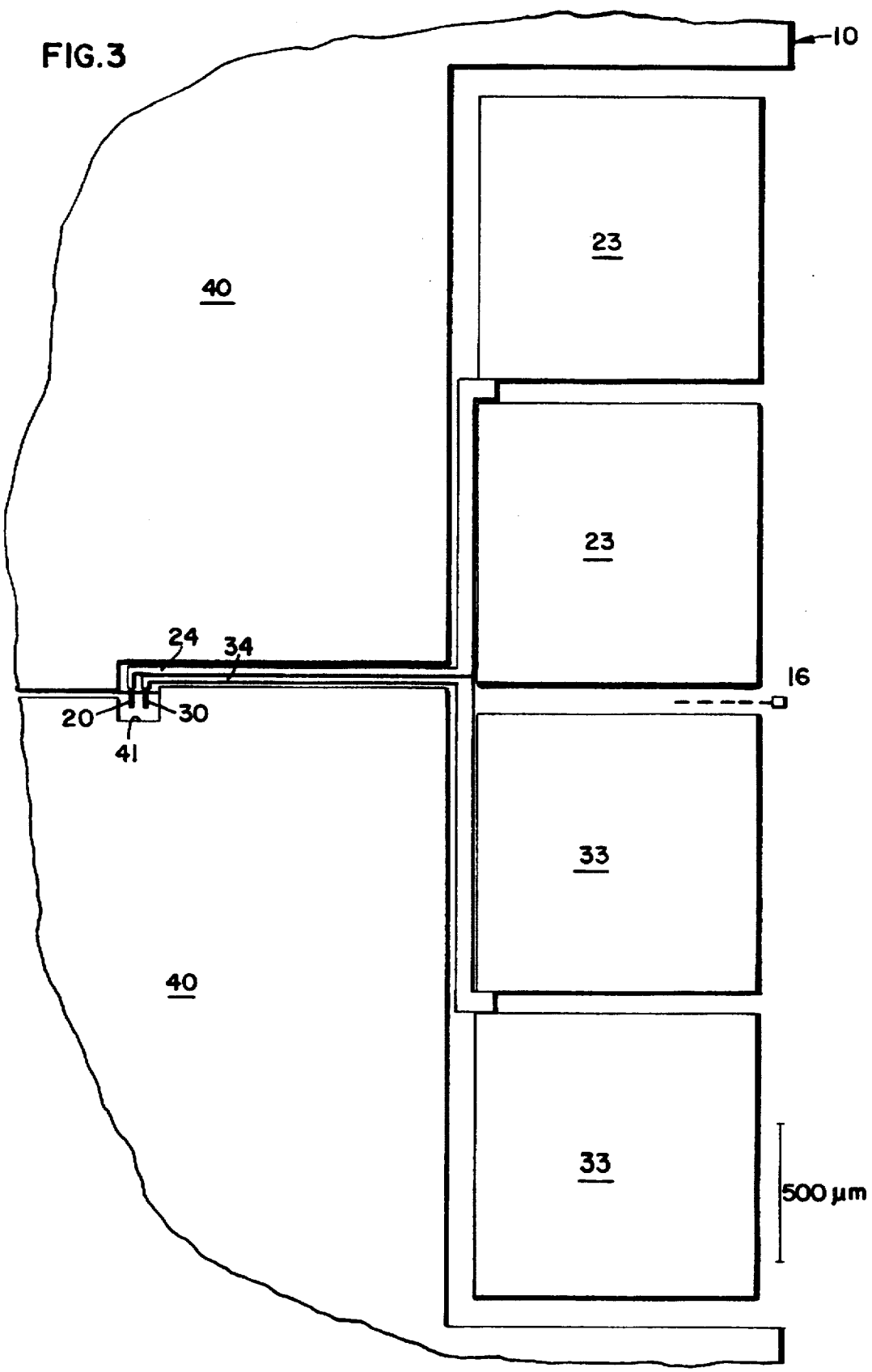
FIG. 3 is an enlarged view of that portion of the magnetometer of FIG. 1 containing the two SQUIDs and the output terminals of the device, illustrated at a magnification of approximately 3 times that of FIG. 1.

Referring to the overall magnetometer illustration of FIG. 1, and the partial magnification of FIG. 3, it will be noted that the SQUIDs 20 and 30 are positioned in the gap 41 formed by that superconductor material pattern forming the two halves of the enlarged pick-up loop 40. The (+) and (−) bias terminals 23 and 33 respectively comprise gold covered output pads or terminals along one edge of the pick-up loop 40 and magnetometer 10, and are physically connected to the SQUIDs 20 and 30 respectively by path runs 24 and 34 of the superconductor material. The runs 24 and 34 follow and lie within the gap 41 formed by the pick-up coil 40, and run in parallel manner to one another and to the grain boundary 16. Symmetry in the conductor runs 24 and 34 from the output pads 23 and 33 to the SQUIDs 20 and 30 respectively is maintained as much as possible. The output terminals 23 and 33 are suitable for electrical connection to gold wire nail-head bonds, as is customary and well-known in the art.

The individual SQUIDs 20 and 30 have been designed in the preferred embodiment as low-noise devices according to the following considerations. Since the rms magnetic field noise $$\sqrt{S_B}(f) = \sqrt{S_\Phi}(f)/A_{eff},$$

where $$\sqrt{S_\Phi}(f)$$

is the rms flux noise and $A_{eff}$ is the effective flux capture area of the magnetometer, the magnetic field noise is optimized by minimizing the flux noise and maximizing the effective area.

The flux noise is given by $$\sqrt{S_\Phi}\,(f) = \sqrt{S_v}\,(f) / \frac{\partial V}{\partial \Phi}$$

where $\sqrt{S_v}(f)$ is the rms voltage noise across the SQUID and $$\frac{\partial V}{\partial \Phi}$$

is the flux-to-voltage transfer function. In the absence of excess noise due to poor film quality, junction parameter fluctuations or resonances, simulations for a SQUID with resistance R and critical current $I_c$ per junction, respectively, and operating at temperature T, give $S_v(f)=\gamma k_B TR$. For this embodiment, the numerical factor $\gamma \approx 16$. Assuming the SQUID voltage-flux (V-$\Phi$) characteristics are sinusoidal, the transfer function $\partial V/\partial \Phi \approx \pi \Delta V$, where $\Delta V$ is the peak-to-peak voltage modulation of the SQUID. Then, the flux noise power is given by $S_\Phi(f)=\gamma k_B TR/(\pi \Delta V)^2$.

The maximum voltage modulation of a SQUID with inductance L has been shown to be $$\Delta V = \frac{4}{\pi}\,\frac{I_c R}{1+\beta}\left[1 - 3.57\frac{\sqrt{k_B T L}}{\Phi_o}\right],$$

where $\beta = 2LI_c/\Phi_o$. The term in brackets in the above equation accounts for the thermal noise flux of the SQUID which may become significant for high SQUID inductances and operation at 77 K. According to simulations, optimum performance requires that $\beta \approx 1$. Neglecting the bracketed noise flux term in the above equation, and taking $\beta \approx 1$, it follows that $\partial V/\partial \Phi \approx R/L$, and the flux noise power $S_\Phi(f) \propto L^2/R$. For optimum performance, the SQUID should therefore have low inductance and junctions with high resistance. As the SQUID inductance L is reduced, however, the condition $\beta \approx 1$ requires that the critical current $I_c$ become proportionately larger. For a given junction technology, the junction resistance generally becomes smaller as the critical current is increased. Furthermore, coupling to the SQUID becomes increasing difficult as the inductance is reduced, resulting in a smaller flux capture area. These two constraints must be taken into account in choosing the SQUID inductance.

For a single dc SQUID magnetometer, the effective flux capture area of the magnetometer is given by $A_{eff}=A_s+k\,(A_p/L_p)L \approx k\,(A_p/L_p)\,L$, where $A_s$ is the effective area of the SQUID loop, $A_p$ is the effective area of the pick-up loop with inductance $L_p$, and k is a constant which describes the coupling efficiency. The coupling constant is optimized by maximizing the fraction of the SQUID inductance seen by the injected signal current. For the magnetometer of the preferred embodiment, and with the above criteria in mind, each of the SQUIDs 20 and 30 is formed from a 65 µm long, 20 µm wide strip of YBCO (26 and 36) with a 55 µm long, 4 µm wide slit (27 and 37) along its length. The 6 µm long, 2–4 µm wide grain boundary junctions (21, 22, 31, 32) are located at the outer end of the slit (see FIG. 4) along with two 5 µm wide injection leads (40a and 40b) for the signal current in the pick-up loop.

The SQUID inductance for each SQUID 20 and 30 may be written as the sum of two parts, $L=L_{s1}+L_j$, where $L_{s1}$ is the slit inductance and $L_j$ is the parasitic inductance associated with the junctions. Using standard inductance formulas for coplanar lines, for individual SQUIDs of the preferred embodiment, $L_{s1}$ equals 42 pH, and $L_j$ equals 9 pH, which include kinetic inductance contributions of 6 pH and 4 pH respectively. Therefore, the total inductance L equals 51 pH (for each SQUID) and the coupling constant $k \approx L_{s1}/L = 0.82$. Experimental measurements for determining the quantity kL by directly cutting the pick-up loop on similar SQUIDs and injecting the current into the SQUID have shown that the measurements agree with the above inductance calculations to better than 5%.

For a square pick-up loop with outer side length (a) and inner side length (d), it can be shown that the ratio $A_p/L_p$ gradually approaches a maximum in the limit (a–d)/2>d. In this limit, $A_p=ad$, and $L_p=1.25 \mu_o d$, so that $A_p/L_p=a/1.25 \mu_o=0.637a$ [mm] mm²/nH. Then, the effective area of the magnetometer $A_{eff} \approx 0.637a$ [mm] $L_{s1}$[nH] mm².

The magnetometer of the preferred embodiment has a 1 cm×1 cm bicrystal substrate. In order to satisfy the condition (a–d)/2>d, (a) equals 9.3 mm and (d) equals 6 mm were used. For these parameter values, $A_{eff} \approx 0.25$ mm². Actual measurements have indicated a slightly smaller value for $A_{eff}$, which difference may be accounted for by including the inductance of the long slit of the pick-up loop 41 which increases $L_p$ and reduces the calculated $A_{eff}$ by an estimated 12%.

Prior magnetometers configured with a single directly coupled SQUID according to the above criteria have displayed excellent noise characteristics. The magnetic field noise $\sqrt{S_B(f)}$ of the magnetometer, measured using ac bias at 2 kHz, yielded a white field noise above 10 Hz of 10 fT/√Hz with a gradual increase to 26 fT/√Hz at 1 Hz.

For the dual series-connected SQUID magnetometer configuration of the preferred embodiment, a signal detected by the pick-up coil 40 coherently modulates the series-connected SQUIDs, resulting in up to twice the voltage modulation of a single SQUID at the output. The voltage noise of the two SQUIDs connected in series is expected to be √2 times higher than that of a single SQUID. This is offset by the enhancement of the maximum voltage modulation by a factor of 2, which correspondingly increases the flux-to-voltage transfer coefficient by the same factor. Thus, the flux noise, and consequently flux density noise, are reduced by a factor of √2/2=1/√2. Another advantage of the series-connected configuration is that the output impedance is twice that of a single SQUID configuration, which simplifies matching to the room-temperature electronics connected to the magnetometer.

Figure 5:
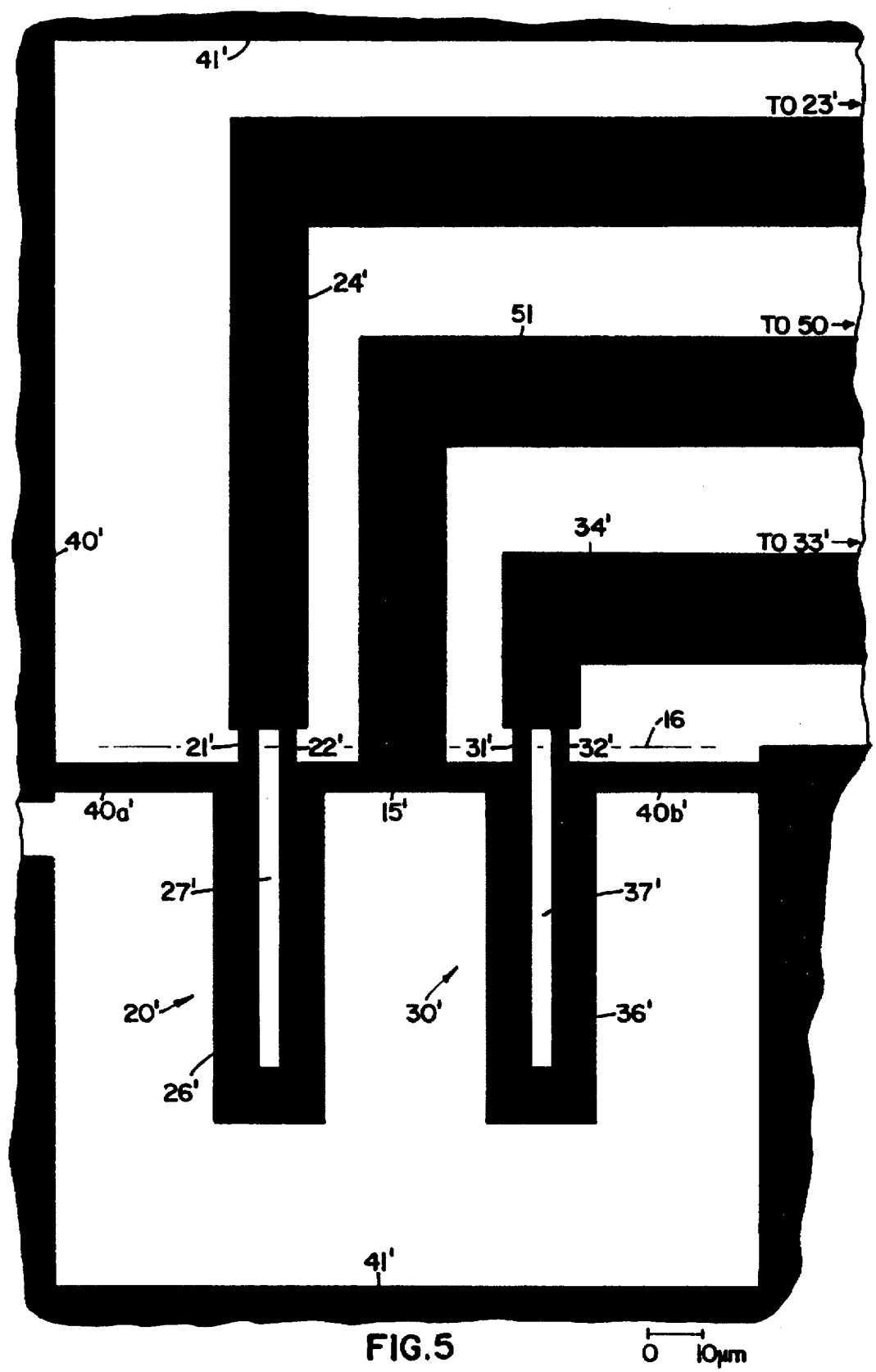
FIG. 5 is an enlarged view of an alternately configured embodiment of the SQUID portion of a magnetometer of the general type illustrated in FIG. 1, illustrating a center tap biasing connection to the SQUIDs, and generally viewed at a magnification of 160 times that of FIG. 1.
Figure 6B:
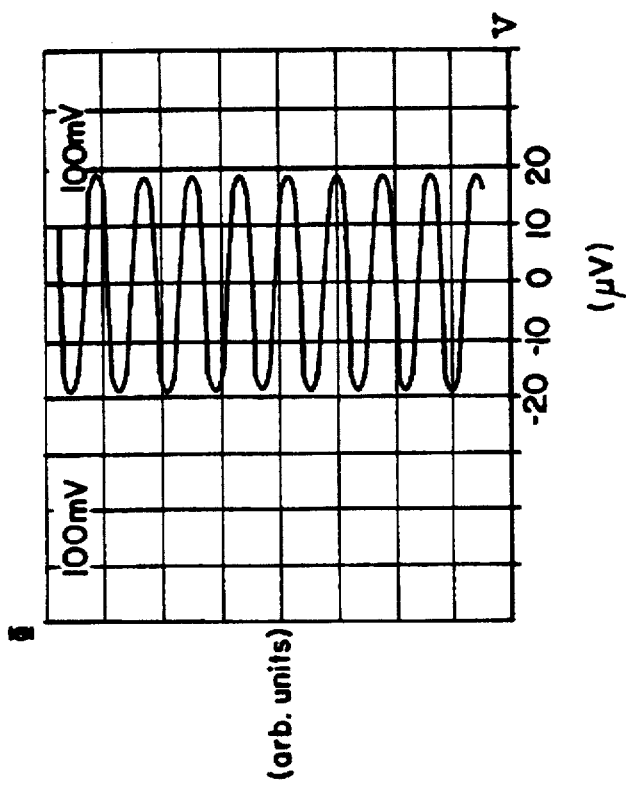
FIG. 6b illustrates the V-$\Phi$ characteristics of the SQUID.
Figure 6A:
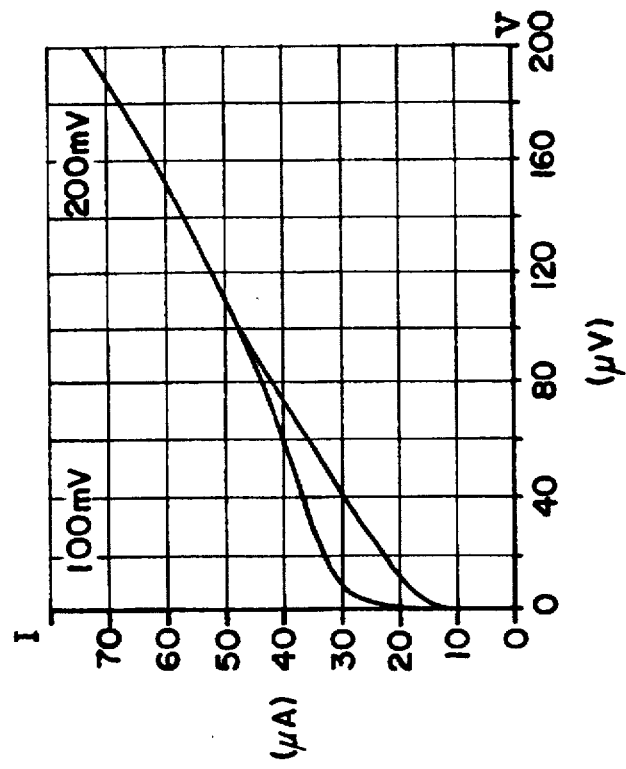
FIG. 6a illustrates the I–V characteristics of the SQUID.
Figure 7B:
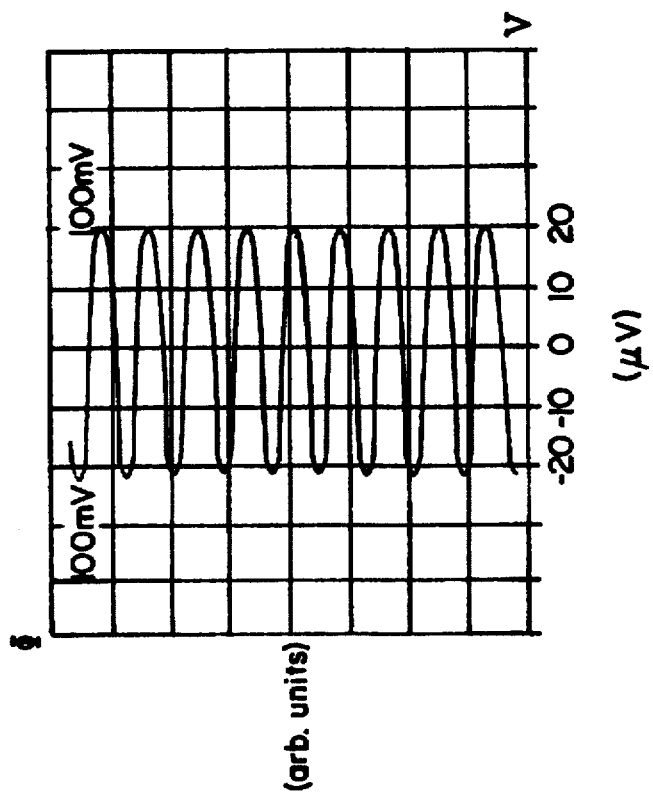
FIG. 7b illustrates the V-$\Phi$ characteristics of the SQUID.
Figure 7A:
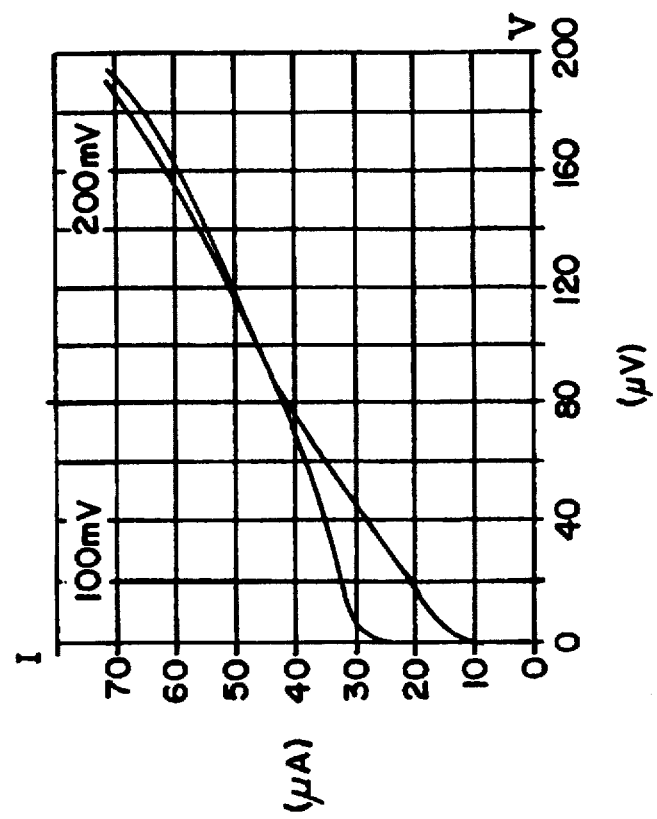
FIG. 7a illustrates the I–V characteristics of the SQUID.

A second embodiment of the invention is shown in FIG. 5. The FIG. 5 magnetometer configuration differs from that of FIGS. 1–4 only in the fact that an additional center-tap terminal 50 leading by means of a superconductor material path run 51 to the series-connecting link 15' of the series-connected SQUIDs has been included. The center-tap terminal enables the SQUIDs 20' and 30' to be separately biased. The numerical designations of those elements of FIG. 5 that are the same as those of FIG. 4 have been designated by the same numerals used in FIG. 4, followed by a prime (') designation. With such alternate configuration, the I–V and V-Φ characteristics of each of the SQUIDs 20' and 30' was independently measured. The measured characteristics for the magnetometers formed using each of the two SQUIDs separately, are plotted in FIGS. 6 and 7 respectively for the SQUIDs 20' and 30' respectively. Referring thereto, it will be noted that both SQUIDs are observed to have comparable critical current $2I_c \approx 32$ µA and resistance R/2≈5.8 ohms. The voltage modulation of SQUID 20', $\Delta V_{20} \approx 38$ µV, and the voltage modulation of SQUID 30', $\Delta V_{30} \approx 42$ µV, are also comparable. The predicted value of the voltage modulation of the magnetometer when the two SQUIDs 20' and 30' are connected in the double-SQUID configuration should be the sum of the voltage modulation of each of the SQUIDs acting separately, or $\Delta V_{20}+\Delta V_{30}=80$ µV.

The center tapped dual SQUID configuration with independent biasing permits the use of the device with only one SQUID operating. This increases manufacturing yield and extends the useful life of the device since the device is still operative after a single SQUID fails.

FIG. 8 represents the plots of the measured parameters the magnetometer 10 when both of the SQUIDs 20' and 30' were connected in series, according to the principles of this invention. Referring thereto, it is noted that the total critical current does not change, but that the total resistance is now twice as large. This is expected, since the two SQUIDs are nearly identical. Also, the total voltage modulation is observed to be 79 µV, which is very close to the predicted result. Accordingly, the measurements confirm that the voltage modulation of the double series-connected direct coupled SQUID configuration is additive and results in a significant enhancement of the output signal, which as previously discussed should reduce the magnetometer's flux density noise by a factor of 1/√2.

While the present invention has been described with respect to its application as illustrated in a preferred embodiment configuration of a magnetometer, and with respect to preferred configurations of the SQUID portions thereof, it will be understood that a number of variations of the magnetometer and the SQUID embodiments used are possible. Similarly, it will be understood that the invention is equally applicable to other SQUID devices, such as gradiometers. Similarly, while a specific type of high-$T_c$ superconductor material and bicrystal substrate have been used to describe the preferred embodiment magnetometer, it will be understood that other superconductor materials and techniques for forming the Josephson junctions can be used and will be readily recognized by those skilled in the art. All such modifications of the invention will become apparent to those skilled in the art in light of the foregoing description. This description is intended to provide a specific example of an embodiment which clearly distinguishes and discloses the present invention. Accordingly, the invention is not limited to the described embodiment, or to the use of specific components, configurations or materials described herein. All alternative modifications and variations of the invention which fall within the broad scope of the appended claims are covered.

What is claimed is:

1. A single layer multiple SQUID configuration, comprising:

(a) a substrate;

(b) superconductor materials adhered in a single layer to said substrate in a pattern defining:

(i) a first dc SQUID having a first pair of Josephson junctions and defining a first SQUID loop having a first signal injection port;

(ii) a second dc SQUID having a second pair of Josephson junctions and defining a second SQUID loop having a second signal injection port;

(iii) an interconnecting link connecting said first and said second SQUID loops in series;

(iv) a first bias lead operatively extending from said first SQUID loop to a first output terminal;

(v) a second bias lead operatively extending from said second SQUID loop to a second output terminal; wherein bias current applied through said first output terminal and said first bias lead to said first SQUID is withdrawn from said second SQUID by said second bias lead and said second output terminal, such that said first and said second SQUIDS are operatively connected in series; and (vi) a pick-up loop having first and second ends directly connected respectively to said first and said second signal injection ports; and (vii) wherein said pick-up loop is operatively connected in parallel with the series-connected loops of said first and said second SQUIDs to form a single layer direct signal injection magnetometer configuration.

2. The multiple SQUID configuration of claim 1, wherein said first and said second SQUIDs are of identical configuration and are symmetrically arranged next to each other.

3. The multiple SQUID configuration of claim 2, wherein said first and said second pairs of Josephson junctions are physically aligned along a common line.

4. The multiple SQUID configuration of claim 2, wherein said substrate defines a grain boundary and wherein said first and said second pairs of Josephson junctions overlie said grain boundary.

5. The multiple SQUID configuration of claim 4, wherein said interconnecting link is oriented to lie parallel to and in close proximity with said grain boundary.

6. The multiple SQUID configuration of claim 1, wherein said interconnecting link is oriented to connect with said first and said second SQUIDs in close proximity respectively to said first and said second pairs of Josephson junctions thereof.

7. A single layer multiple SQUID configuration, comprising:

(a) a substrate;

(b) superconductor materials adhered in a single layer to said substrate in a pattern defining:

(i) a first dc SQUID having a first pair of Josephson junctions and defining a first SQUID loop;

(ii) a second dc SQUID having a second pair of Josephson junctions and defining a second SQUID loop;

(iii) an interconnecting link connecting said first and said second SQUID loops in series;

(iv) a first bias lead operatively extending from said first SQUID loop to a first output terminal;

(v) a second bias lead operatively extending from said second SQUID loop to a second output terminal; and (vi) a third bias lead operatively extending from said interconnecting link to a third terminal for enabling independent biasing of said first and said second dc SQUIDs; and (c) wherein bias current applied through said first output terminal and said first bias lead to said first SQUID is withdrawn from said second SQUID by said second bias lead and said second output terminal, such that said first and said second SQUIDs are operatively connected in series.

8. The multiple SQUID configuration of claim 1, wherein said superconductor material is of a type that displays superconductive properties at a transition temperature ($T_c$) above 77 Kelvin.

9. The multiple SQUID configuration of claim 1, wherein said pattern further defines first and second signal injection paths extending respectively from said first and said second signal injection ports to said first and said second ends of said pick-up loop; and wherein said first and said second signal injection paths are symmetrically configured and aligned on said substrate.

10. The multiple SQUID configuration of claim 1, wherein said first and said second signal injection ports are symmetrically located relative to said first and said second SQUIDs in close proximity respectively to said first and said second pairs of Josephson junctions thereof.

11. A low-noise directly coupled dc SQUID magnetometer, comprising:

(a) a pair of dc SQUIDs operatively connected in a series configuration;

(b) a pick-up loop operatively directly coupled in parallel with said pair of dc SQUIDs; and (c) wherein said dc SQUIDs and said pick-up loop are all configured from a single layer of superconductor material; whereby signals in said pick-up loop are directly injected into said pair of dc SQUIDs.

12. The magnetometer of claim 11, wherein said superconductor material is a high-$T_c$ superconductor material having a transition temperature $T_c$ greater than or equal to 77 Kelvin.

13. The magnetometer of claim 12, wherein said superconductor material comprises YBCO film.

14. The magnetometer of claim 14, wherein said YBCO film comprises $YBa_2Cu_3O_{7-x}$ material.

15. The magnetometer of claim 11, wherein said superconductor material defines bias leads and a series-connecting link operatively connected to said pair of dc SQUIDs for enabling bias current to be applied to a first one of said pair of SQUIDs and withdrawn from the other of said pair of SQUIDS.

16. The magnetometer of claim 15, wherein each of said dc SQUIDS includes a pair of Josephson junctions and wherein said series-connecting link physically connects the pair of dc SQUIDs closely adjacent to said Josephson junctions of said SQUIDs.

17. The magnetometer of claim 11, wherein each of said dc SQUIDs includes a pair of Josephson junctions, and wherein said pick-up loop is physically directly coupled to said pair of dc SQUIDs closely adjacent to the Josephson junctions of said SQUIDs.

18. A low-noise directly coupled dc SQUID magnetometer, comprising:

(a) a pair of dc SQUIDs operatively connected in series by an interconnecting link;

(b) a pick-up loop operatively directly coupled in parallel with said pair of dc SQUIDs;

(c) an output terminal operatively connected with said interconnecting link; and (d) wherein said dc SQUIDs, interconnecting link and said pick-up loop are all configured from a single layer of superconductor material; whereby signals in said pick-up loop are directly injected into said pair of dc SQUIDs.

19. The magnetometer of claim 18, wherein said output terminal enables each SQUID of said pair of dc SQUIDS to be separately biased.

* * * * *

UNITED STATES PATENT AND TRADEMARK OFFICE
CERTIFICATE OF CORRECTION

PATENT NO. : 5,767,043

DATED : JUNE 16, 1998

INVENTOR(S) : CANTOR ET AL.

It is certified that error appears in the above-identified patent and that said Letters Patent is hereby corrected as shown below:

Col. 8, line 36: "$\sigma V / \sigma \Phi$" should read -- $\partial V / \partial \Phi$ --

Col. 8, line 52: "$\sigma V / \sigma \Phi$" should read -- $\partial V / \partial \Phi$ --

Col. 10, line 9: "20" should read --20'--

Signed and Sealed this

Fifteenth Day of May, 2001

*Attest:*

NICHOLAS P. GODICI

*Attesting Officer*     *Acting Director of the United States Patent and Trademark Office*